United States Patent [19]

Nehoda

[11] Patent Number: 5,801,651
[45] Date of Patent: Sep. 1, 1998

[54] MANCHESTER DECODER WITH RECEIVED SIGNAL BLANKING

[75] Inventor: Charles J. Nehoda, Broadview Heights, Ohio

[73] Assignee: Allen Bradley Company, Inc., Milwaukee, Wis.

[21] Appl. No.: 671,288

[22] Filed: Jun. 27, 1996

[51] Int. Cl.$^6$ .................................................. H03M 5/12
[52] U.S. Cl. .................................................. 341/70
[58] Field of Search .................................. 341/70, 68, 94; 371/6, 25.1, 57.2

[56] References Cited

U.S. PATENT DOCUMENTS

5,170,396  12/1992  Rivers et al. .................................. 371/6

*Primary Examiner*—Brian K. Young
*Attorney, Agent, or Firm*—Dave G. Leuttgen; John M. Miller; John J. Horn

[57] ABSTRACT

A Manchester decoder blanks random transitions prior to the reception of a valid Manchester encoded signal. Specifically, the decoder according to the present invention comprises a data input, and edge detector, and a blanking device. The edge detector is used to detect edges in a signal which is received by the data input. Thus, in the event that edges are not detected at predetermined intervals (signifying that a valid signal is not being received), the blanking device blanks a data output of the decoder. Advantageously, the decoder circuit filters random transitions prior to the reception of a valid Manchester encoded signal, is of simple construction, and may be implemented in conjunction with a decoder circuit which is used to separate the Manchester encoded signal into its data and clock components.

24 Claims, 6 Drawing Sheets

MANCHESTER DECODER WITH RECEIVED SIGNAL BLANKING

FIELD OF THE INVENTION

This invention relates to a decoder for encoded signals, and more particularly relates to a decoder which blanks random transitions occurring prior to the reception of a valid signal such as a Manchester encoded signal.

DESCRIPTION OF RELATED ART

Manchester encoding is a well-known technique in which data and data clock components are combined into a single encoded signal. The encoded signal is divided into time slots (data cycles) of equal duration during each of which one bit of information is conveyed. There is always one signal transition per time slot which usually occurs at the center of the time slot; and the value of the bit is indicated by the direction of the transition.

An encoder coupled to a transmitter at one end of the communication link combines the data and data clock components into the single Manchester encoded signal. At the opposite end of the communication link, a decoder coupled to a receiver is used to separate the encoded signal into its data and clock components. Assuming the communication link is bi-directional, there is a transmitter/encoder and a decoder/receiver combination at each side of the communication link.

To initiate the transmission of data, one of the transmitters takes control of the communication link and transmits a flag signal which comprises a series of transitions and which indicates that it is about to send data. By detecting the series of transitions, the receiver can recognize that data is about to be sent. At the end of the data transmission, another flag signal is sent which indicates the end of the data transmission.

Notably, prior to the transmission of the flag signal, neither transmitter has control of the communication link and the communication link is allowed to float. During this period, the communication link is especially susceptible to noise, which may be in the form of random transitions on the communication link. These random transitions can create what looks like a flag signal, and the problem faced is that the receiver gets confused between the random noise transitions and the transitions associated with valid flag signals.

Of course, it is known in the prior art that transmitted Manchester signals are susceptible to noise, and various systems have been developed to counteract noise. However, these systems generally assume that a valid signal is being received, and do not address the problems faced with noise that is received prior to the transmission of a valid Manchester encoded signal. Thus, these systems are quite complicated and deal with noise on a data cycle by data cycle basis.

To the limited extent that the present problem has been addressed, it has generally been addressed by way of the software used by the synchronous receiver. Thus, the decoder decodes and communicates all "data" signals to the receiver (regardless whether the signals are truly data or merely noise), and the receiver is left to decide whether or not a valid signal has been transmitted. Essentially, the receiver accomplishes this by studying the decoded data to ascertain whether it makes any sense. This process has been found to be unnecessarily complicated and generally unsatisfactory.

What is needed is a simple device and method for overcoming the problems associated with random transitions which occur prior to the reception of a valid signal, especially where the signal is of the Manchester encoded type. The device and method should blank the random transitions, such that only valid signals are passed on to the synchronous receiver.

BRIEF SUMMARY OF THE INVENTION

A Manchester decoder with received signal blanking is presented. Specifically, a device according to the present invention comprises a data input, an edge detector, and a blanking device. The edge detector is used to detect edges in a signal which is received by the data input. When edges are not detected at predetermined intervals (signifying that a valid signal is not being received), the blanking device blanks the data output of the device.

To determine whether the detected edges are valid, an edge validation state machine is used. The edge validation state machine is implemented as a Mealy-type machine which establishes two timing windows. Edges which occur during the first timing window are considered invalid and are ignored. Edges which occur during the second timing window are considered valid and are counted by an edge counting state machine which counts the total number of sequentially detected valid edges. The edge counting state machine outputs a blanking signal to the blanking device, which blanks the data output based on the blanking signal. The data output is blanked until a predetermined number of valid edges have been detected.

Advantageously, the present invention is both simple and highly effective for eliminating random transitions which occur prior to the reception of a valid signal such as a Manchester encoded signal. Generally, as discussed above, a decoder circuit is necessary when using Manchester encoded signals in order to detect the Manchester encoded signal and separate it into its data and clock components. Surprisingly, the present invention is able to leverage the need for a decoder circuit. In other words, the decoder circuit according to the present invention performs not only the usual decoder functions, but also functions to eliminate random transitions occurring prior to the reception of a valid signal. All of this is achieved with minimal additional parts, cost and complexity.

Other objects, features, and advantages of the present invention will become apparent to those skilled in the art from the following detailed description and accompanying drawings. It should be understood, however, that the detailed description and specific examples, while indicating preferred embodiments of the present invention, are given by way of illustration and not limitation. Many modifications and changes within the scope of the present invention may be made without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which.

DETAILED DESCRIPTION OF THE PREFERRED EMBODIMENT

Figure 1A:
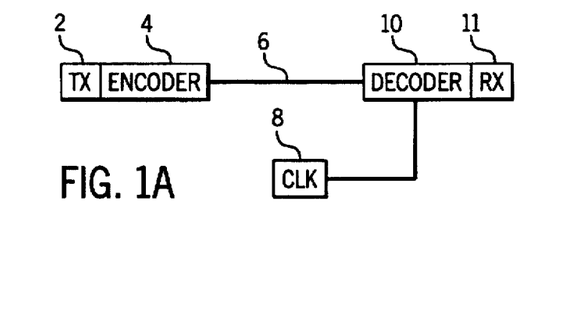
FIG. 1A illustrates a communication system having a decoder circuit in accordance with the present invention.

FIG. 1A illustrates a communication system which incorporates a decoder circuit 10 in accordance with the present invention. The communication system comprises a transmitter 2, an encoder 4, a communication link 6, an external clock 8, the decoder circuit 10, and an synchronous receiver 11. If the communication link is bi-directional (as is normally the case), then a second decoder/receiver combination and a second transmitter/encoder combination (not illustrated) are disposed on opposite sides of the communication link 6.

Figure 1B:
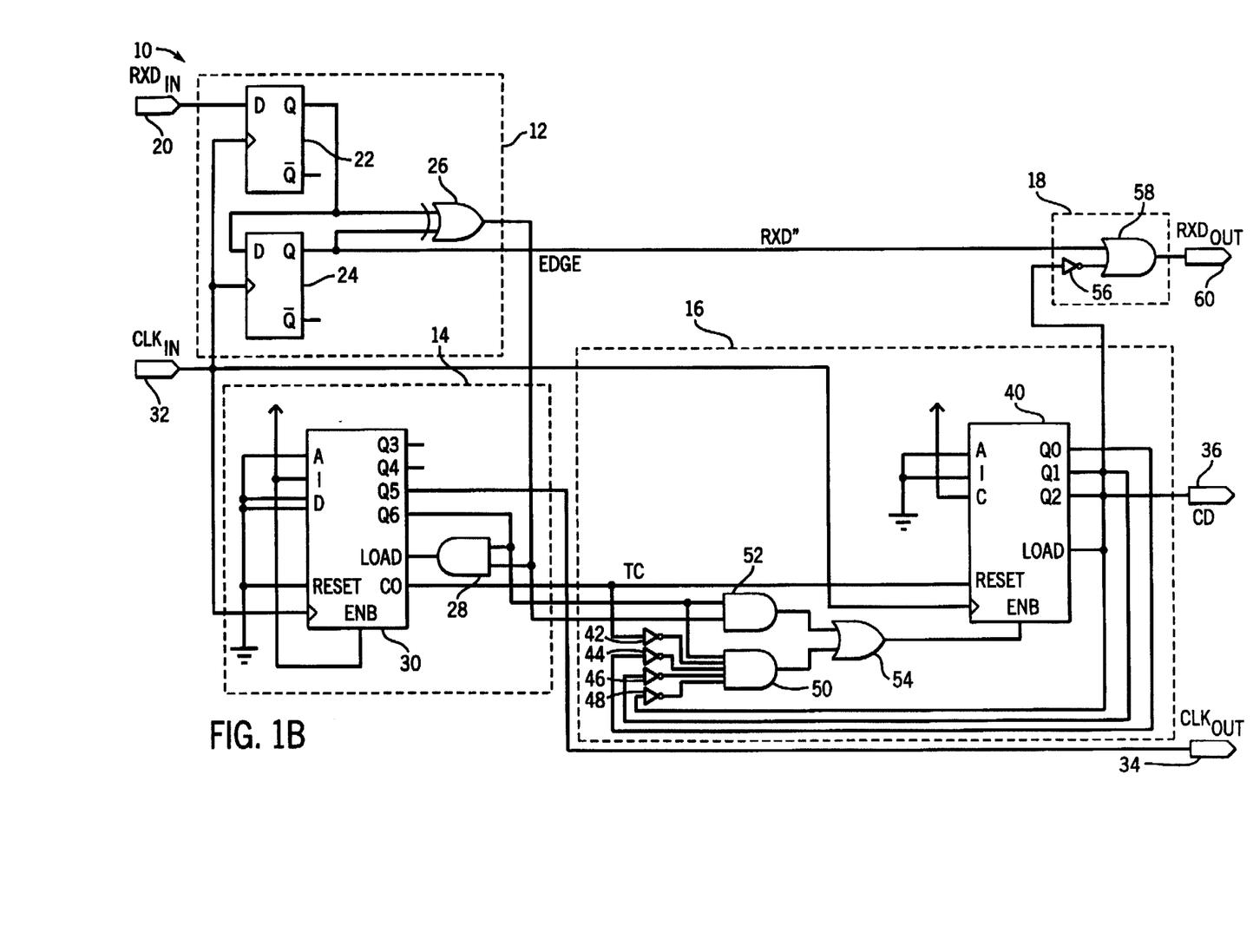
FIG. 1B illustrates in greater detail the decoder circuit of FIG. 1A.

FIG. 1B illustrates in greater detail the decoder circuit 10 illustrated in FIG. 1A. By way of overview, the decoder circuit 10 comprises an edge detector 12, an edge validation state machine 14, an edge counting state machine 16 and a blanking circuit 18. A received $RXD_{IN}$ signal is input to the edge detector 12. The edge detector 12 detects edges in the $RXD_{IN}$ signal, the state machine 14 ensures that the edges occur during predetermined timing windows (thereby ensuring that the edges are valid), and the state machine 16 counts the number of sequentially detected valid edges.

The basic operating principle on which these components operate is that, in a valid Manchester encoded signal, edges should be occurring at regular intervals. Thus, if an edge (as detected by edge detector 12) has occurred within a predetermined interval following a preceding edge (as determined by the edge validation state machine 14), and if this has happened enough times (as determined by the edge counting state machine 16), then the signal is highly likely to be valid. Advantageously, this arrangement permits the state machine 16 to output a signal to a blanking circuit 18 which causes the $RXD_{OUT}$ signal to be blanked until a valid signal has been detected. Simultaneously, these components are advantageously used to separate the Manchester signal into its data and clock components and to generate a carrier detect signal for the receiver 11.

More specifically, the decoder circuit 10 is connected to the communication link by way of an input 20, which receives the input signal $RXD_{IN}$. The decoder circuit 10 is also connected to an external clock and receives a $CLK_{IN}$ signal at input 32. The $CLK_{IN}$ signal has a frequency which is eight times the frequency of the $RXD_{IN}$ signal (although other frequency multiples could be used), and is fed to the clock signal inputs of flip-flops 22 and 24 and of counters 30 and 40.

The $RXD_{IN}$ signal is fed to the edge detector 12, which comprises two series connected D flip-flops 22 and 24 and an XOR gate 26 having inputs connected to the outputs of the flip-flops 22 and 24. The XOR gate 26 outputs an Edge signal which indicates whether an edge or transition has occurred in the $RXD_{IN}$ signal. Thus, if there is a transition in the $RXD_{IN}$ signal (so that the outputs of the two series connected D flip-flops 22 and 24 are different), then Edge=1. Otherwise, if there is no transition, then Edge=0. The D flip-flop 24 also outputs an RXD" signal, which is the same as the $RXD_{IN}$ signal except that it is delayed by two clock cycles.

Figure 2:
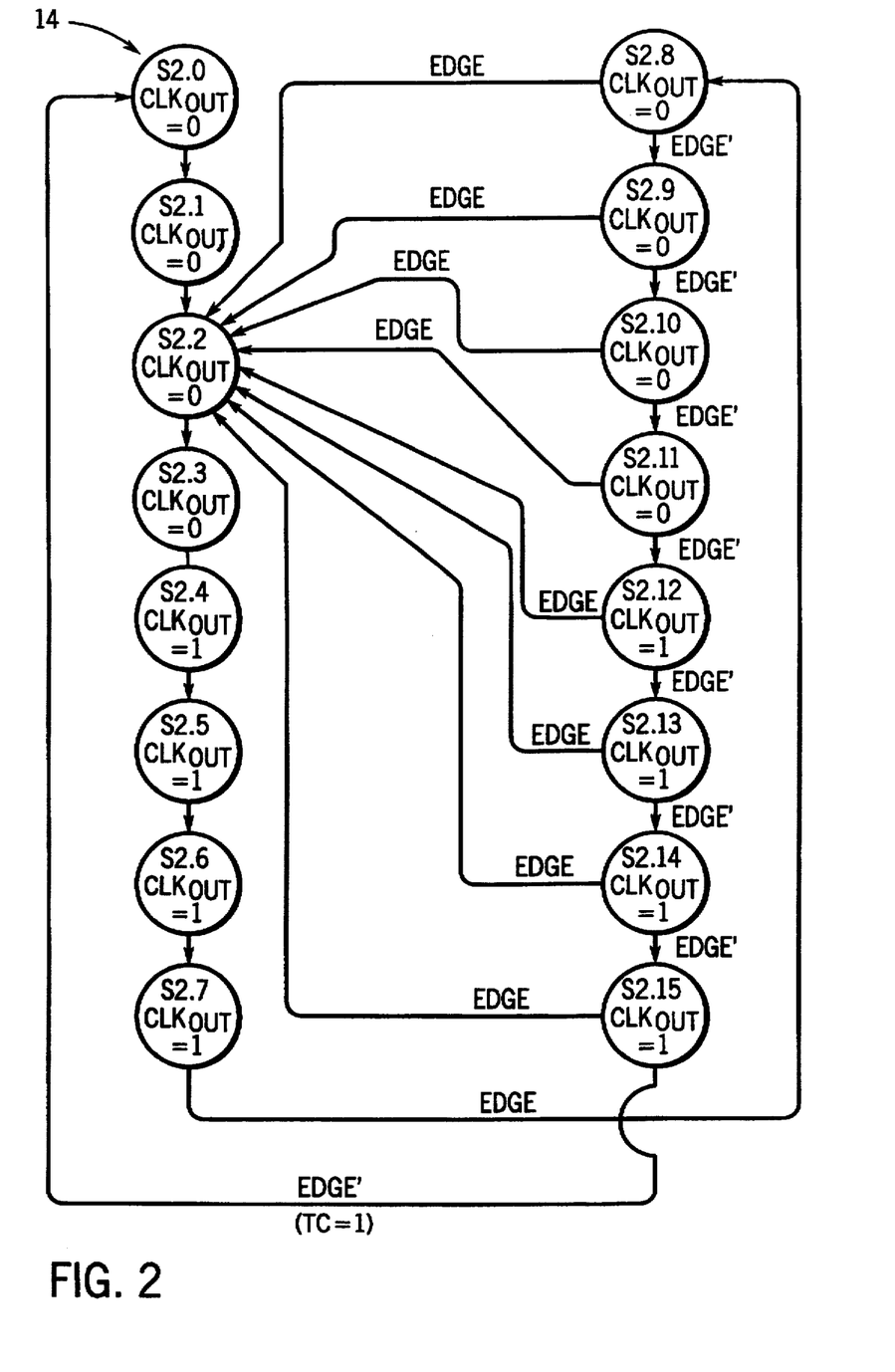
FIG. 2 illustrates a state diagram for the edge validation state machine used in the decoder circuit of FIG. 1B, in accordance with the present invention.

After an edge is detected by the edge detector 12, the state machine 14 ascertains whether the edge occurred during a predetermined timing window and is thus to be considered valid. Accordingly, the Edge signal is fed to the state machine 14, which comprises an AND gate 28 and a four bit counter 30. The AND gate 28 and the counter 30 implement a Mealy-type state machine, the state diagram of which is illustrated in FIG. 2.

As indicated by the state diagram, the state machine 14 has sixteen states S2.0 to S2.15. (For clarity, the "S2" prefix distinguishes the states of the state machine 14 from the states of the state machine 16, which are designated with an "S1" prefix.) The state (0–15) of the state machine 14 is simply the decimal equivalent of the bits $Q_3$–$Q_6$. Thus, $Q_6Q_5Q_4Q_3$=0000 corresponds to state S2.0, $Q_6Q_5Q_4Q_3$=0001 corresponds to state S2.1, continuing to $Q_6Q_5Q_4Q_3$=1111 which corresponds to state S2.15.

There are two categories of states of the state machine 14: (1) states S2.0 to S2.7, and (2) states S2.8 to S2.15. States S2.8 to S2.15 are the predetermined timing window during which valid edges occur. In other words, in order to be considered valid, the edge must occur during the predetermined timing window defined by the states S2.8 to S2.15. If an edge occurs during one of the states S2.0 to S2.7, it is considered invalid and is ignored.

As noted above, the basic operating principle of the components 12, 14 and 16 is that edges should be occurring at regular intervals if the signal is a valid signal. Thus, an edge is considered valid if it occurs during a predetermined timing window (not too soon and not too long) after the occurrence of a previous edge. The term "invalid" is loosely used to encompass other edges including not only noise related transitions, but also some types of transitions which may be completely expected. For example, where the flag signal comprises a series of high to low transitions, each of the high to low transitions is necessarily separated by a low to high transition (see FIG. 4A). The low to high transitions, while not noise, are nevertheless ignored.

The state machine 14 starts at state S2.0 unless an edge was detected during the previous timing window, in which case the state machine 14 starts at state S2.2. In either case, the state machine 14 automatically advances to the next state during the states S2.0 to S2.7, and eventually reaches state S2.8. (The state machine 14 thus ignores edges that occur during the states S2.0 to S2.7.) Starting at the state S2.8, the state machine 14 advances to the next state only if an edge is not detected. If an edge is detected, the state machine 14 returns to state S2.2 and starts again. In FIG. 1, this is implemented by feeding the Edge signal and the $Q_6$ bit (which is high during the states S2.8 to S2.15) to the AND gate 28. The output of the AND gate 28 is fed to the Load input of the counter 30, which immediately causes the value $Q_6Q_5Q_4Q_3$=0010 (state S2.2) to be loaded based on the inputs A–D when Edge and the $Q_6$ bit are both high. Since the enable input ENB is tied high, it always increments by one with each $CLK_{IN}$ clock cycle, i.e., except (1) when the Load input is high and (2) when the counter 30 resets after reaching state S2.15.

If no edges occur during any of the states S2.8 to S2.15, the state machine 14 restarts at state S2.0. The significance of passing through state S2.15 to state S2.0 is that an edge has not occurred during the predetermined timing window. Based on this fact, the conclusion is drawn that the decoder circuit 10 is not receiving a valid signal, and the Terminal Count signal is set high (TC=1). (Note that since the frequency of the $CLK_{IN}$ signal is eight times the frequency of the data signal, one data signal transition should occur every eight clock cycles/counter states, assuming a valid signal.) The Terminal Count signal may be implemented using the Carry Out (CO) output of the counter 30. This output equals one when $Q_6Q_5Q_4Q_3=1111$, and otherwise equals zero.

Figure 3:
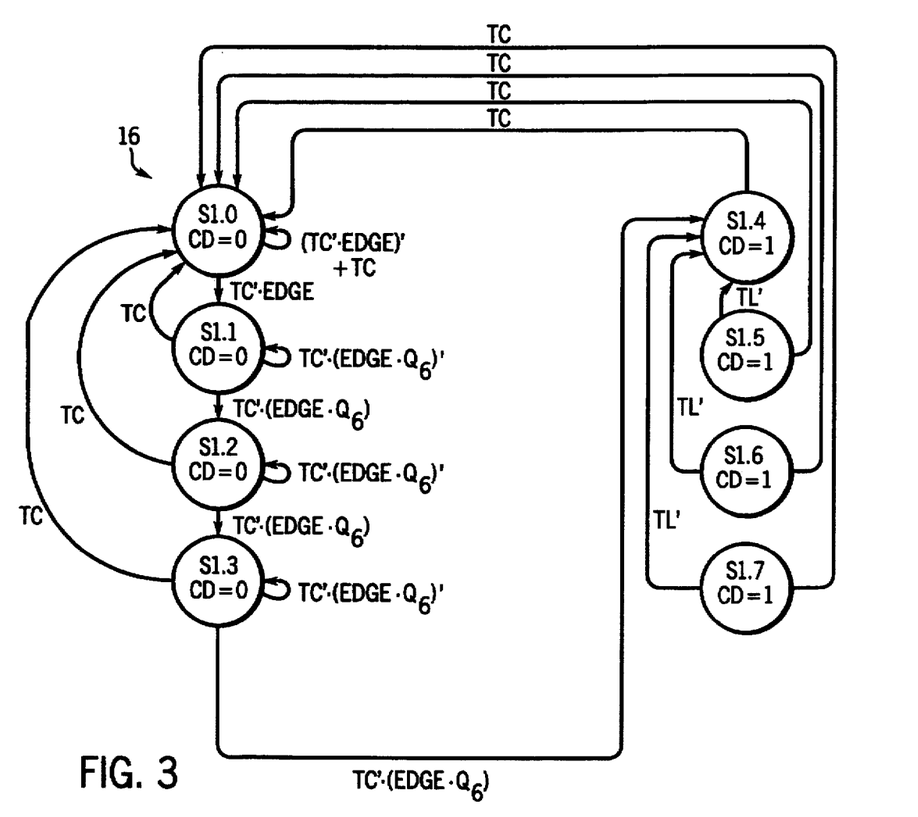
FIG. 3 illustrates a state diagram for the edge counting state machine used in the decoder circuit of FIG. 1B, in accordance with the present invention.

To count the number of valid edges that have been detected, the decoder circuit 10 comprises the state machine 16 which (like the state machine 14) receives the Edge signal from the edge detector 12 and the $CLK_{IN}$ signal from the external clock. The state machine 16 comprises a three bit counter 40, NOT gates 42–48, AND gates 50 and 52, and an OR gate 54. These components also implement a Mealy-type state machine, the state diagram of which is illustrated in FIG. 3.

As indicated by the state diagram, the state machine 16 has eight states S1.0 to S2.7. The state (0–7) of the state machine 16 is simply the decimal equivalent of the bits $Q_0$–$Q_2$. Thus, $Q_2Q_1Q_0=000$ corresponds to state S1.0, $Q_2Q_1Q_0=001$ corresponds to state S1.1, continuing to $Q_2Q_1Q_0=111$ which corresponds to state S1.7.

There are four categories of states of the state machine 16: (1) S1.0, (2) S1.1 to S1.3, (3) S1.4, and (4) S1.5 to S1.7. Unlike the state machine 14, which advances to another state with every $CLK_{IN}$ clock cycle, the state machine 16 only advances to a new state upon certain conditions involving the Terminal Count signal, the Edge signal, the value of the bit $Q_6$, and the present state of the state machine 16. Specifically, the enable input ENB is connected to the OR gate 54 and is high (and the counter 40 increments) only when the output of either of the AND gates 50 and 52 is high. Thus, unlike the counter 30 whose enable input ENB is always tied high, the level of the enable input ENB of the counter 40 varies depending on the above-mentioned signals.

The state machine 16 starts at the state S1.0, which is the state to which the state machine 14 returns whenever the Terminal Count signal goes high (TC=1). (As discussed above, TC=1 means that edges are not occurring at regular intervals, which implies that a valid signal is not being received.) In practice, advancement to the state S1.0 after TC=1 is implemented by feeding the Terminal Count signal to the Reset input of the counter 40, which when high resets $Q_2Q_1Q_0=000$.

To advance from state S1.0 to the state S1.1, the Edge signal must go high (and the Terminal Count signal must be low). Note that it is not necessary for the edge to occur during a predetermined timing window. The state S1.0 is thus unlike states S1.1 to S1.3 in this respect. Since what makes an edge valid is that it occurred during a predetermined timing window after the occurrence of a previous edge, the first edge has no predetermined timing window.

In practice, advancement from state S1.0 to S1.1 is accomplished by the AND gate 50 and the NOT gates 42–48. The NOT gate 42 is used to ensure that the Terminal Count signal is low, whereas the NOT gates 44–48 are used to ensure that $Q_2Q_1Q_0=000$ (and thus that the state machine 16 is in the state S1.0).

During the states S1.1 to S1.3, the decoder circuit 10 counts the number of valid edges that have occurred. Thus, the states S1.1 to S1.3 correspond to a progressively increasing number of valid edges having occurred. Accordingly, in order to advance to the next state during states S1.1 to S1.3, it is always necessary that Edge·$Q_6=1$ (and that Terminal Count is low). Thus, an edge signal must have occurred (Edge=1), and the edge must have occurred during the appropriate timing window (the states S2.8 to S2.15 of the state machine 14, corresponding to $Q_6=1$). In practice, this is implemented by the AND gate 52 which receives the Edge signal and the $Q_6$ output.

Given that there are three counting states S1.1 to S1.3, it should be apparent that three properly timed edges are required for a signal to be considered valid. It has been found that requiring three properly timed edges is ideal. The occurrence of one edge which is properly timed with respect to a previous edge is possible though unlikely, the occurrence of two edges which are properly timed with respect to previous edges is more unlikely, and the occurrence of three edges which are properly timed with respect to previous edges is highly unlikely. It has been found that the requirement of additional properly timed edges after three does not add significantly to the effectiveness of the present invention at filtering unwanted transitions.

During the state S1.4, the required number of valid edges have been received, and the receiver is receiving data. The state machine 16 does not leave the state S1.4 unless the Terminal Count signal goes high, as previously discussed.

The final three states S1.5 to S1.7 remain unused. Thus, should the state machine 16 for some reason be in one of these states, it immediately proceeds to one of the states S1.0 or S1.4, depending on the value of the Terminal Count signal.

The blanking circuit 18 is used eliminate transitions from the output signal $RXD_{OUT}$. For this purpose, the blanking circuit 18 tests the $Q_2$ bit which is applied to the NOT gate 56. Accordingly, when the state machine 16 is in any of the states S1.0 to S1.3, the $Q_2$ output is low, the output of the NOT gate 56 is high, and the output of the OR gate 58 is high (regardless of the state of the RXD" signal). The output of the decoder circuit 10 is thus blanked because it is forced high until a valid signal has been detected. Of course, the output of the decoder circuit 10 could also be blanked in other ways, such as by forcing the output low. In general, any predetermined transition or bit pattern (in addition to those in which there are no signal level transitions at all) may be used so long as the decoder circuit 10 outputs a signal which is recognizable as not containing transmitted data.

Advantageously, as previously mentioned, the circuit 10 can also be used to separate the Manchester encoded signal into its data and clock components and to generate a carrier detect signal. Generally, the frequency of the clock component of the Manchester encoded signal is determined well in advance and is known to both sides of the communication link. However, what is not known is the phase of the clock signal. Thus, the step of extracting the clock component from the Manchester encoded signal in essence comprises the steps of generating a clock signal having the same frequency as the clock component of the Manchester encoded signal, and then synchronizing the clock signal to the Manchester encoded signal.

This process is implemented in the following manner. As described above, the $CLK_{IN}$ signal has a frequency which is eight times the frequency of the clock component of the Manchester signal. To divide the $CLK_{IN}$ signal by eight, the $Q_5$ output of the counter 30 is used. The $Q_5$ bit is the third bit of the four bit counter 30, and thus changes levels every four $CLK_{IN}$ clock cycles and has a complete cycle every eight $CLK_{IN}$ clock cycles (high for four states and low for four states) as illustrated in FIG. 2. The $CLK_{OUT}$ signal is synchronized to the $RXD_{IN}$ signal due to the fact that the Edge signal ultimately controls when the state machine 14 returns to state S2.2.

To generate a Carrier Detect (CD) signal, the $Q_2$ bit of the counter 40 is utilized. As discussed above, the decoder circuit 10 has not yet detected a valid signal when the state machine 16 is in the states S1.0 to S1.3 (during which $Q_2=0$). When the state machine 16 is in the state S1.4 (during which $Q_2=1$), a valid signal has been detected. Thus, the $Q_2$ bit of the counter 40 may be used to generate the Carrier Detect signal.

Figure 4A:
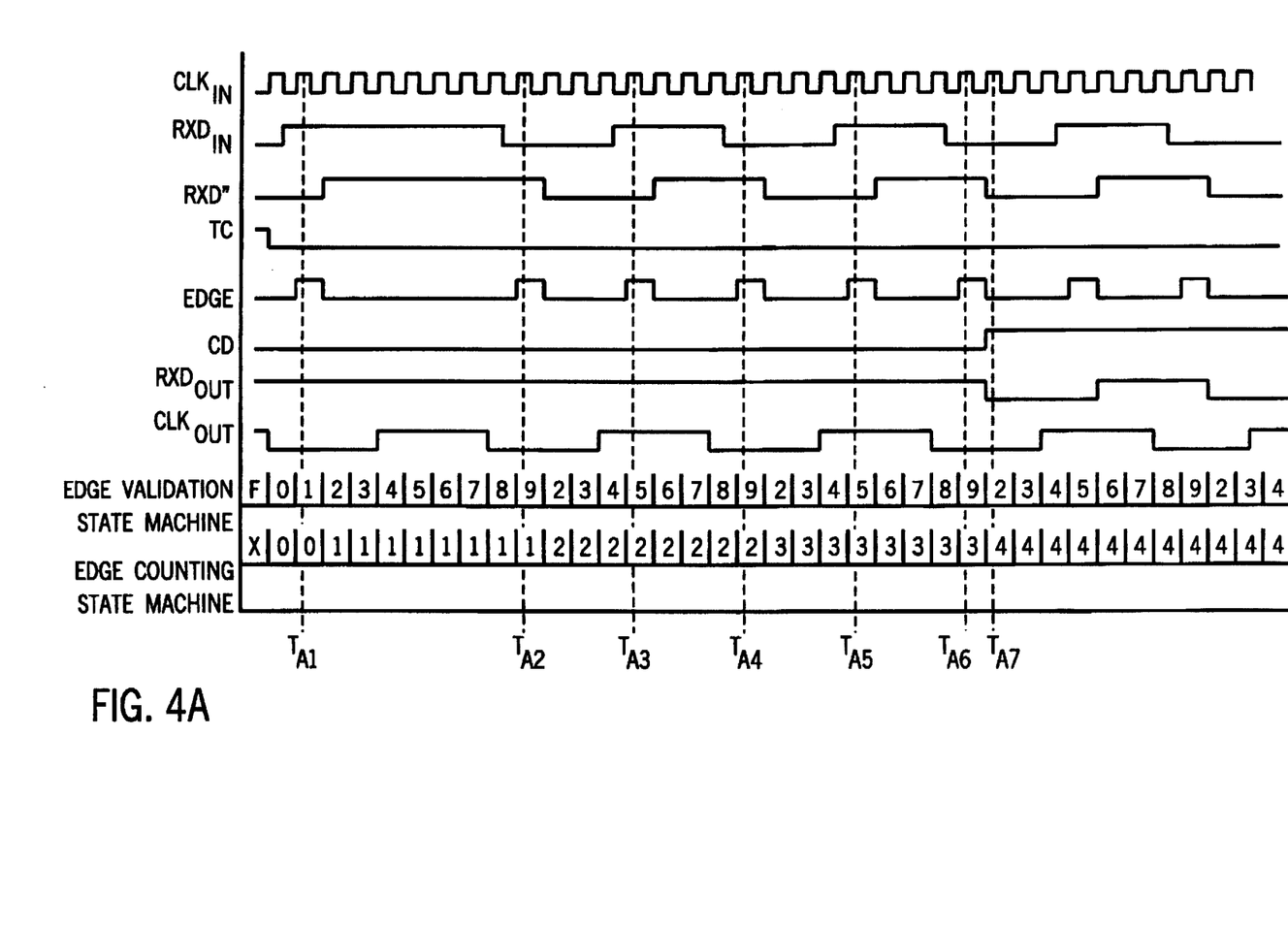
FIGS. 4A–4C are timing diagrams which illustrate the operation of the decoder circuit illustrated in FIG. 1B, in accordance with the present invention.
Figure 4B:
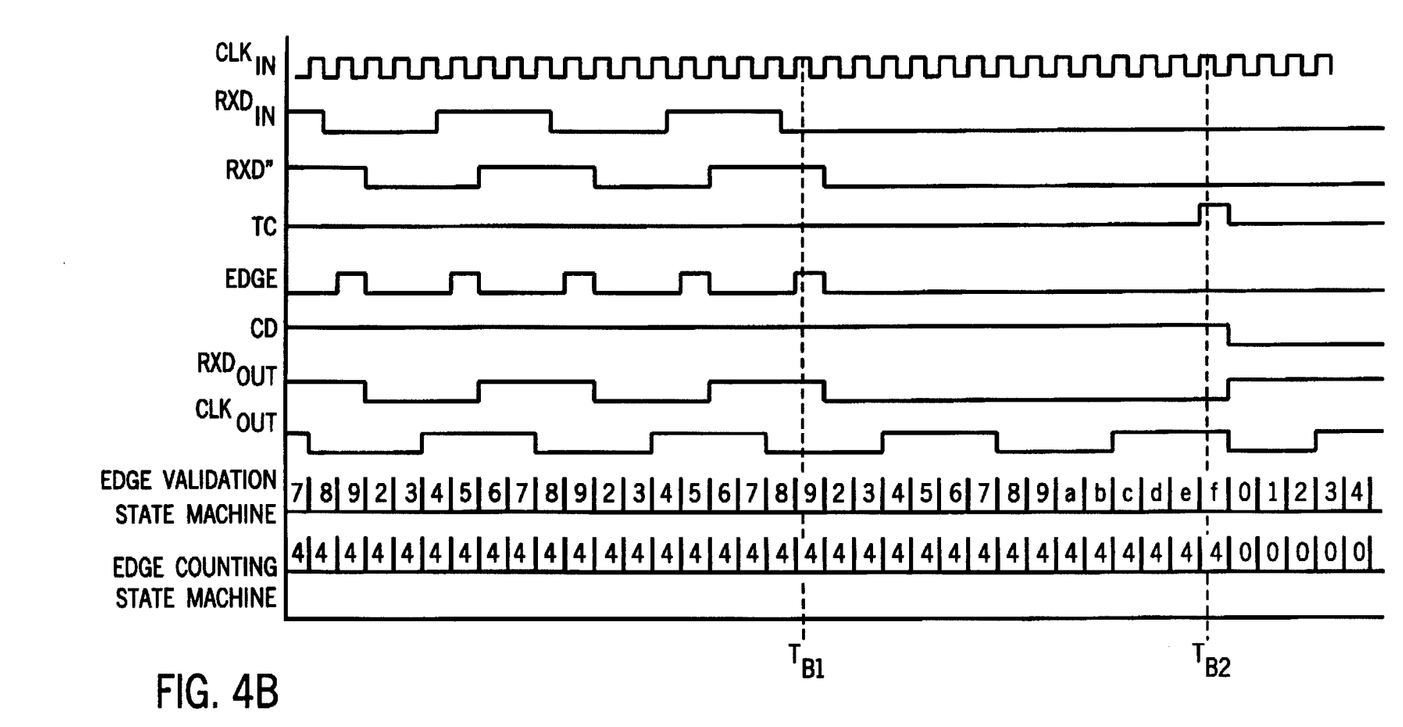
Figure 4C:
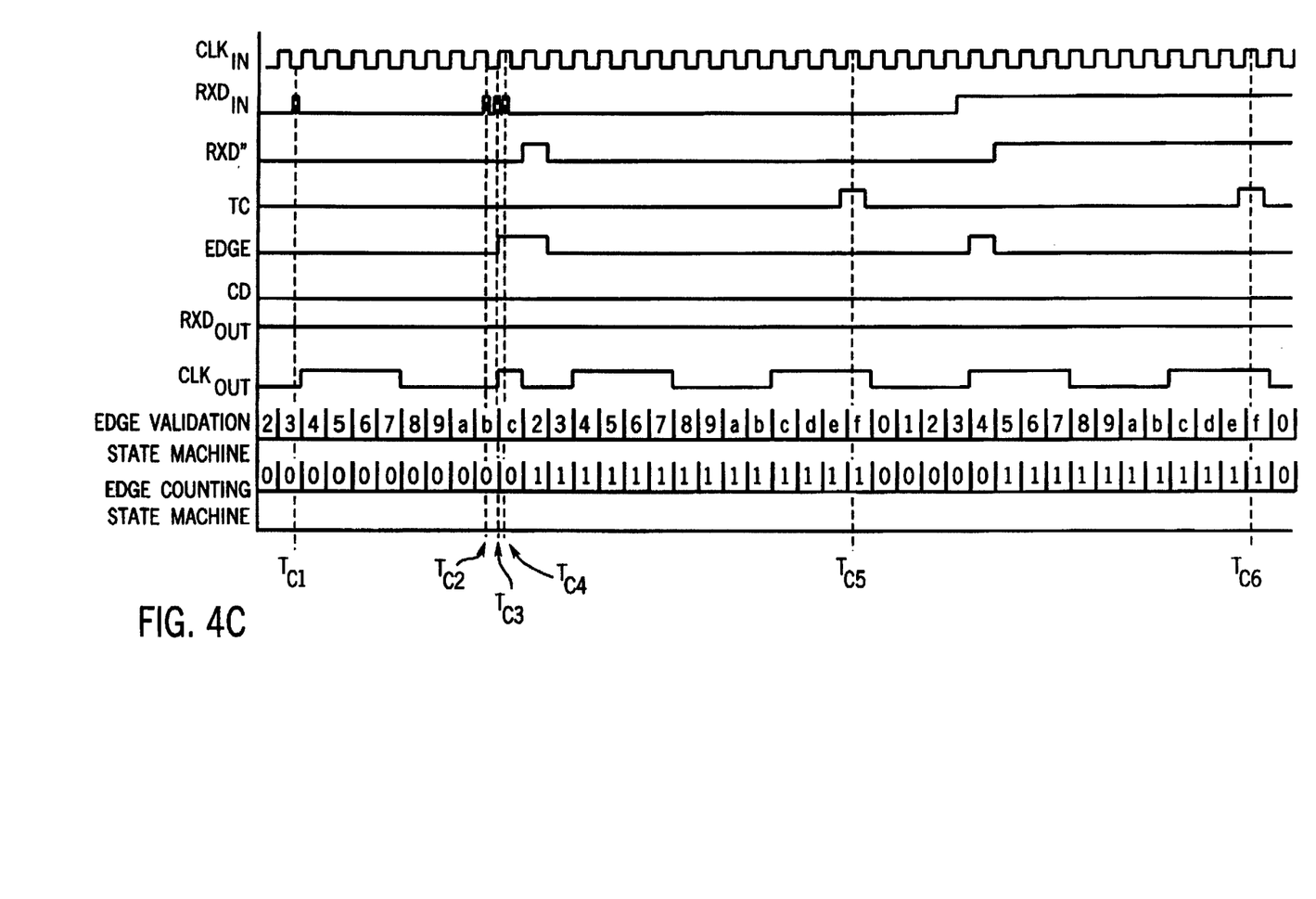

FIGS. 4A–4C are timing diagrams which illustrate several examples of the operation of the decoder circuit 10. Specifically, FIG. 4A is an example of the operation of the decoder circuit 10 to detect an opening sequence of bits which precedes a Manchester encoded signal. Initially, the $RXD_{OUT}$ signal is blanked and remains high despite transitions in the $RXD_{IN}$ signal. Also, since no signal has been detected, the Carrier Detect signal is low.

At time instant $T_{A1}$, the levels of the $RXD_{IN}$ and RXD" signals are different, and the Edge signal has gone high. As a result, the edge counting state machine 16 advances from state S1.0 to state S1.1 at the next clock cycle. As discussed above, the first edge is recognized even though it occurred during state S2.1 and thus not during the timing window. (Note that in FIGS. 4A–4C, the decimal state numbers of the state machine 16 are represent by their hexadecimal equivalents.)

At time instant $T_{A2}$, another edge has occurred. Since this edge occurs at the state S2.9 (during the timing window), the state machine 16 advances to the next state S1.2 at the next clock cycle.

At time instant $T_{A3}$, another edge has occurred. However, this edge occurred at state S2.5 (not during the timing window), and consequently the state machine 16 does not advance. Likewise, although additional edges have occurred at time instants $T_{A4}$, $T_{A5}$ and $T_{A6}$, only the edges that occurred at time instants $T_{A4}$ and $T_{A6}$ cause the state machine 16 to advance to state S1.4. At time instant $T_{A7}$, the state machine 16 has reached state S1.4 and the $RXD_{OUT}$ signal is no longer blanked.

FIG. 4B is an example of the operation of the decoder circuit 10 to blank the output of the decoder circuit 10 after the transmission of a Manchester encoded signal has been terminated. Initially, the decoder circuit 10 is receiving a valid Manchester encoded signal. The last transition has occurred at time instant $T_{B1}$. Subsequently, no more edges occur, and the Terminal Count signal is generated at time instant $T_{B2}$ followed by the Carrier Detect signal going low and the blanking of the $RXD_{OUT}$ signal.

FIG. 4C is an example of the operation of the decoder circuit blanking random transitions not associated with valid flag signals. In this example, a first random transition is received at a time instant $T_{C1}$. The first random transition is filtered by the fact that it is not properly timed with respect to the flip flops 22 and 24, and thus never gets latched.

Additional random transitions are received at time instants $T_{C2}$, $T_{C3}$, and $T_{C4}$. These transitions result in the Edge signal going high, and in the state machine 16 advancing to state S1.1. However, subsequent transitions are not received during the appropriate timing window, and thus the Terminal Count signal goes high at approximately time instant $T_{C5}$, resulting in the state machine 16 going back to state S1.0. Thus, the transitions occurring at time instants $T_{C2}$, $T_{C3}$, and $T_{C4}$ are not seen in the $RXD_{OUT}$ signal. In similar fashion, although the $RXD_{IN}$ later floats high, the Terminal Count signal goes high at approximately time instant $T_{C6}$, and the transition is not seen in the $RXD_{OUT}$ signal.

It should be noted that there are a variety of other ways of implementing the present invention. For example, the present invention can be implemented using a programmable array logic (PAL) device. As is known, PAL devices can be programmed with relative ease using the ABEL programming language. A program listing which can be used to program a PAL in accordance with the present invention has also been included below. The program listing results in a PAL device which has the two state machines 14 and 16 described by the state diagrams illustrated in FIGS. 2–3 and which has the other characteristics of the decoder circuit 10 illustrated in FIG. 1B.

Many other changes and modifications may be made to the present invention without departing from the spirit thereof. The scope of these and other changes will become apparent from the appended claims.

We claim:

1. A method of filtering a data output of a decoder, the method comprising the steps of
   receiving an input signal at a data input of said decoder;
   determining that said input signal is a valid data signal; and
   blanking said data output of said decoder until said determining step is complete, and approximately then discontinuing said blanking, said blanking of said data output comprising the step of causing said data output of said decoder to output an output signal having a predetermined pattern which is recognizable as being devoid of transmitted data.

2. The method according to claim 1, wherein said valid data signal is a Manchester encoded signal having a substantially constant frequency.

3. The method according to claim 1, further comprising additional blanking steps, and wherein said data output is always blanked continuously for time intervals corresponding to at least three data cycles of said valid data signal.

4. The method according to claim 1, wherein said determining step further comprises the steps of
   detecting edges in said valid data signal; and
   determining that a predetermined number of edges have been detected during individual predetermined timing windows.

5. A method of filtering a data output of a decoder, the method comprising the steps of
   receiving an input signal at a data input of said decoder;
   determining that said input signal is a valid data signal; and
   blanking said data output of said decoder until said determining step is complete, and approximately then discontinuing said blanking, said blanking of said data output comprising the step of causing said data output of said decoder to remain at a constant level regardless of transitions in said input signal.

6. A method according to claim 1, wherein the method is implemented in a device consisting essentially of a programmable array logic device coupled to a clock signal generator.

7. An apparatus comprising:
   a data input which receives an input signal;
   an edge detector, said edge detector being coupled to said data input, and said edge detector detecting edges in said signal;
   a blanking device, said blanking device including a data output which outputs an output signal, said data output being blanked when said edges are not detected at predetermined intervals, said data output being blanked such that said output signal has a predetermined pattern which is recognizable as being devoid of transmitted data.

8. The apparatus according to claim 7, wherein said input signal is a Manchester encoded signal having a substantially constant frequency, and wherein said data output is continuously blanked for a period of time corresponding to at least two data cycles of said Manchester encoded signal.

9. The apparatus according to claim 7, further comprising a first state machine which distinguishes between valid edges and invalid edges in said input signal, said first state machine including
- a first plurality of states during which said first state machine advances to a next state independent of whether an edge occurs in said input signal;
- a second plurality of states during which said first state machine advances to a next state dependent on whether an edge occurs in said input signal.

10. The apparatus according to claim 9, further comprising
- a second state machine, said second state machine including first, second, and third states which correspond to a number of valid edges which have been detected; and wherein
- said second state machine outputs a blanking signal to said blanking device when said second state machine is in said first, second and third states, said blanking signal causing said data output to remain at a constant level regardless of transitions in said input signal received at said data input.

11. The apparatus according to claim 10, wherein said signal is a Manchester encoded signal having a substantially constant frequency, wherein said first state machine defines means for dividing the frequency of an external clock signal and for synchronizing said external clock signal to said Manchester encoded signal, and wherein said second state machine defines means for generating a carrier detect signal.

12. The apparatus according to claim 10, wherein said data input, said edge detector, said blanking device, said first state machine, and said second state machine are implemented in a device consisting essentially of a programmable array logic chip.

13. A method of detecting a Manchester encoded signal, the method comprising the steps of
- receiving said Manchester encoded signal;
- detecting a first edge in said Manchester encoded signal, said first edge occurring during a first data cycle of said Manchester encoded signal; then
- detecting a second edge in said Manchester encoded signal, said second edge occurring during a second data cycle of said Manchester encoded signal which follows consecutively after said first data cycle, said second edge detecting step including the step of verifying that said second edge occurred during a second edge timing window, said second edge timing window being initiated in delayed fashion after said detection of said first edge; then
- detecting a third edge in said Manchester encoded signal, said third edge occurring during a third data cycle of said Manchester encoded signal which follows consecutively after said second data cycle, said third edge detecting step including the step of verifying that said third edge occurred during a third edge timing window, said third edge timing window being initiated in delayed fashion after said detection of said second edge; and
- determining that said Manchester encoded signal is valid (1) based on the detection of a predetermined number of properly timed edges, including said first, second, and third edges and (2) based on said predetermined number of properly timed edges having been detected during consecutive data cycles;
- blanking said Manchester encoded signal, said blanking starting no later than when said first edge is detected and ending no sooner than when it has been determined that said Manchester encoded signal is valid, said Manchester encoded signal being blanked such that a data output has a predetermined pattern which is recognizable as being devoid of transmitted data.

14. The method according to claim 13, wherein said Manchester encoded signal has a substantially constant frequency.

15. The method according to claim 13, further comprising the steps of
- detecting an additional edge;
- ascertaining that there have not been any further additional edges occurring within a predetermined amount of time after said additional edge; and
- in response to said ascertaining step, blanking said Manchester encoded signal.

16. The method according to claim 13, wherein said blanking step comprises the step of maintaining a constant signal level output despite transitions in said Manchester encoded signal.

17. A method according to claim 13, wherein the method is implemented in a device consisting of a programmable array logic device coupled to a clock signal generator.

18. A communication system comprising
- a transmitter coupled to an encoder which combines clock and data components into a Manchester encoded signal of substantially constant frequency;
- a communication link;
- a receiver coupled to a decoder, said receiver and said decoder being coupled to said transmitter and said encoder via said communication link, said decoder detecting and decoding said Manchester encoded signal, said decoder further including
  - an edge detector coupled to said communication link, said edge detector receiving said Manchester encoded signal and detecting edges in said Manchester encoded signal,
  - an edge validation state machine which distinguishes between valid edges and invalid edges in said Manchester encoded signal, said edge validation state machine having
    - a first plurality of states during which said edge validation state machine advances to a next state independent of whether an edge occurs in said Manchester encoded signal, and
    - a second plurality of states during which said edge validation state machine advances to a next state dependent on whether an edge occurs in said Manchester encoded signal,
  - an edge counting state machine, said edge counting state machine having first, second, and third states which correspond to a number of valid edges which have been detected, and wherein said edge counting state machine outputs a blanking signal when said edge counting state machine is in said first, second and third states,
  - a blanking circuit, said blanking circuit receiving said blanking signal from said edge counting state machine and, based on said blanking signal, causing a data output to remain at a constant level regardless of transitions in said Manchester encoded signal.

19. The communication system according to claim 18, wherein said edge validation state machine defines means for dividing the frequency of an external clock signal and for synchronizing said external clock signal to said Manchester encoded signal, and wherein said edge counting state machine defines means for generating a carrier detect signal.

20. The communication system according to claim 18, wherein said decoder consists essentially of a programmable array logic chip coupled to a clock signal generator.

21. A method according to claim 1, wherein said determining step comprises the steps of

- detecting a first edge in said input signal, said first edge occurring during a first data cycle of said input signal; then
- detecting a second edge in said input signal, said second edge occurring during a second data cycle of said input signal which follows consecutively after said first data cycle, said second edge detecting step including the step of verifying that said second edge occurred during a second edge timing window, said second edge timing window being initiated in delayed fashion after said detection of said first edge; then
- detecting a third edge in said input signal, said third edge occurring during a third data cycle of said input signal which follows consecutively after said second data cycle, said third edge detecting step including the step of verifying that said third edge occurred during a third edge timing window, said third edge timing window being initiated in delayed fashion after said detection of said second edge; and
- wherein said input signal is determined to be valid (1) based on the detection of a predetermined number of properly timed edges, including said first, second, and third edges and (2) based on said predetermined number of properly timed edges having been detected during consecutive data cycles.

22. A method according to claim 21, wherein said predetermined number is three, and wherein the detection of said first, second and third consecutive edges is sufficient to cause said input signal to be determined valid.

23. A method according to claim 1, further comprising the step of continuously determining, with each data cycle, whether said input signal remains valid, said input signal being continuously determined valid only if and only if each consecutive data cycle contains a properly timed edge.

24. A method according to claim 13, wherein said predetermined number is three, and wherein the detection of said first, second and third consecutive edges is sufficient to cause said Manchester encoded signal to be determined valid.

* * * * *